United States Patent
Motika et al.

(10) Patent No.: US 7,260,757 B2
(45) Date of Patent: Aug. 21, 2007

(54) SYSTEM AND METHOD FOR TESTING ELECTRONIC DEVICES ON A MICROCHIP

(75) Inventors: Franco Motika, Hopewell Junction, NY (US); William Vincent Huott, Holmes, NY (US)

(73) Assignee: International Business Machines Corporation, Armonk, NY (US)

( * ) Notice: Subject to any disclaimer, the term of this patent is extended or adjusted under 35 U.S.C. 154(b) by 681 days.

(21) Appl. No.: 10/721,646

(22) Filed: Nov. 25, 2003

(65) Prior Publication Data

US 2005/0138501 A1 Jun. 23, 2005

(51) Int. Cl.
*G01R 31/28* (2006.01)

(52) U.S. Cl. .................. 714/732; 714/724; 714/726; 714/733

(58) Field of Classification Search ............. None
See application file for complete search history.

(56) References Cited

U.S. PATENT DOCUMENTS

| | | | |
|---|---|---|---|
| 3,761,695 A | 9/1973 | Eichelberger | 235/153 |
| 4,503,537 A | 3/1985 | McAnney | 371/25 |
| 4,513,418 A | 4/1985 | Bardell et al. | 371/25 |
| 4,598,401 A | 7/1986 | Whelan | 371/25 |
| 4,726,025 A | 2/1988 | Splett et al. | 371/25 |
| 4,893,072 A | 1/1990 | Matsumoto | 371/223 |
| 5,241,281 A * | 8/1993 | Wilkes et al. | 345/213 |
| 5,528,602 A | 6/1996 | West et al. | 371/22.4 |
| 5,742,616 A * | 4/1998 | Torreiter et al. | 714/732 |
| 5,841,867 A * | 11/1998 | Jacobson et al. | 713/187 |
| 5,983,380 A | 11/1999 | Motika et al. | 714/733 |
| 5,991,898 A * | 11/1999 | Rajski et al. | 714/30 |
| 6,311,311 B1 | 10/2001 | Swaney et al. | 716/4 |
| 6,401,226 B1 | 6/2002 | Maeno | 714/728 |
| 6,442,723 B1 | 8/2002 | Koprowski et al. | 714/732 |
| 6,728,901 B1 * | 4/2004 | Rajski et al. | 714/30 |
| 6,954,888 B2 * | 10/2005 | Rajski et al. | 714/739 |
| 7,178,078 B2 * | 2/2007 | Hiraide et al. | 714/739 |
| 2004/0088585 A1 * | 5/2004 | Kaler et al. | 713/201 |
| 2006/0156127 A1 * | 7/2006 | Harter et al. | 714/732 |

FOREIGN PATENT DOCUMENTS

JP 8005711 A 1/1996

OTHER PUBLICATIONS

W.H. Mcanney and J. Savir, "Built-In Checking of the Correct Self-Test Signature", Sep. 1988, IEEE Transactions on Computers, vol., 37, No. 9, pp. 1142-1145.
J. Savir and William H. McAnney, "A Multiple Seed Linear Feedback Shift Register", Feb. 1992, IEEE Transactions on Computers, vol. 41, No. 2, pp. 250-252.
Bernd Konemann, Joachim Mucha and Gunther Zwiehoff, "Built-In Test for Complex Digital Integrated Circuits", Jun. 1980, IEEE Journal of Solid State Circuits, vol. SC-15, No. 3, pp. 315-319.

* cited by examiner

*Primary Examiner*—Phung My Chung
(74) *Attorney, Agent, or Firm*—Cantor Colburn LLP; Lily Neff

(57) ABSTRACT

A system and method for testing first and second sets of electronic devices on a microchip is provided. The first set of devices receive input data and then send output data to a first multiple input shift register (MISR). The second set of devices receiving input data and then sending output data to a second MISR. The method includes determining a first seed signature value associated with the first MISR that induces the first MISR to have a first final signature value comprising a plurality of identical binary values when the first set of devices send valid output data to the first MISR when receiving a first predetermined sequence of input data.

20 Claims, 6 Drawing Sheets

SYSTEM AND METHOD FOR TESTING ELECTRONIC DEVICES ON A MICROCHIP

FIELD OF INVENTION

The invention relates to a system and a method for testing electronic devices on a microchip.

BACKGROUND OF INVENTION

The development of relatively complex microchips has caused microchip designer's to implement test functionality and test devices within the microchips themselves. The built-in-self-test functions are based on several design-for-test (DFT) techniques such as a (i) logic built-in self-test (LBIST) method for testing combinatorial and sequential logic devices, and (ii) array built-in-self- test (ABIST) for testing memory arrays.

Generally, during the built-in self-testing (BIST) of a microchip, a linear feedback shift register (LFSR) on the chip generates a sequence of pseudo-random binary test data which will be used to stimulate the combinatorial or sequential logic devices or memory arrays in the microchip. The test data is clocked into the combinatorial or sequential logic devices, or memory arrays and the output data received from the devices or memory arrays is clocked into a multiple input shift register (MISR) which compresses the data over multiple test data cycles. After the received response data from the devices is compressed over a predetermined number of test cycles, a "signature" value is obtained from the MISR. The signature value is thereafter compared to a desired signature value to determine if any of the combinatorial or sequential logic devices, or memory arrays failed the test sequence.

Further, to test multiple sets of devices on a microchip a plurality of MISR's may be utilized which produce a plurality of signature values during testing. Further, as discussed above each signature value is compared to a predetermined "pass" signature value to determine whether each set of devices associated with the MISR operated correctly. The comparison of the plurality of MISR signatures with a plurality of "pass" signatures can take relatively large amounts of computational effort, time, and additional comparison circuitry components. The inventors herein have thus recognized that there is a need for a simplified system and method for testing combinatorial logic devices, sequential logic devices, and memory arrays in microchips that eliminates the step of comparing the plurality of MISR signatures with the plurality of "pass" signatures to determine whether any of the plurality of sets of devices failed testing.

SUMMARY OF INVENTION

The foregoing problems and disadvantages are overcome by a system and method in accordance with the exemplary embodiments disclosed herein.

A method for testing first and second sets of electronic devices on a microchip in accordance with a first aspect of the present invention is provided. The first set of devices receive input data and then send output data to a first MISR. The second set of devices receiving input data and then send output data to a second MISR. The method includes determining a first seed signature value associated with the first MISR that induces the first MISR to have a first final signature value comprising a plurality of identical binary values when the first set of devices send valid output data to the first MISR when receiving a first predetermined sequence of input data. The method further includes determining a second seed signature value associated with the second MISR that induces the second MISR to have a second final signature value comprising a plurality of identical binary values when the second set of devices send valid output data to the second MISR when receiving a second predetermined sequence of input data. The method further includes initializing first and second states of the first MSR and the second MISR, respectively, to the first and second signature values, respectively. The method further includes inputting the first and second predetermined sequences of input data to the first and second set of devices, respectively, and generating first and second final signatures values from output data received from the first and second set of devices, respectively. Finally, the method includes indicating that the first and second set of devices have failed testing when at least one of the plurality of binary values in the first and second final signature values are not identical.

A system for testing first and second sets electronic devices in a microchip in accordance with a second aspect of the present invention is provided. The system includes a test computer operatively coupled to a first LFSR, a second LFSR, a first MISR, and a second MISR. The test computer is configured to determine a first seed signature value associated with the first MISR that induces the first MISR to have a first final signature value comprising a plurality of identical binary values when the first set of devices send valid output data to the first MISR when receiving a first predetermined sequence of input data. The test computer is further configured to determine a second seed signature value associated with the second MISR that induces the second MISR to have a second final signature value comprising a plurality of identical binary values when the second set of devices send valid output data to the second MISR when receiving a second predetermined sequence of input data. The test computer is further configured to initialize first and second states of the first and second MISRs, respectively, to the first and second seed signature values, respectively. The first LFSR is configured to transmit the first predetermined sequence of test data to the first set of devices. The second LFSR is configured to transmit the second predetermined sequence of test data to the second set of devices. The first and second MISRs are configured to generate first and second final signature values from the output data received from the first and second set of devices, respectively. The system further includes a circuit configured to indicate the first and second set of devices have failed testing when at least one of the plurality of binary values in the first and second final output signature values are not identical.

A system for testing first and second sets of electronic devices on a microchip in accordance with a third aspect of the present invention is provided. The system includes a first MISR having a first seed signature value to obtain a first final signature value comprising a plurality of identical binary values when the first set of devices send valid output data to the first MISR. The system further includes a second MISR being having a second seed signature value to obtain a second final signature value comprising a plurality of identical binary values when the second set of devices send valid output data to the second MISR. The system further includes at least one apparatus configured to transmit the first predetermined sequence of test data to the first set of devices and a second predetermined sequence of test data to the second set of devices. The system further includes the first and second MISRs configured to generate first and second final signature values from the output data received from the first and second set of devices, respectively. Finally, the system includes a circuit configured to indicate the first and second set of devices have failed testing when at least one of the plurality of binary values in the first and second final output signature values are not identical.

BRIEF DESCRIPTION DRAWINGS

DESCRIPTION OF AN EMBODIMENT

Figure 1:
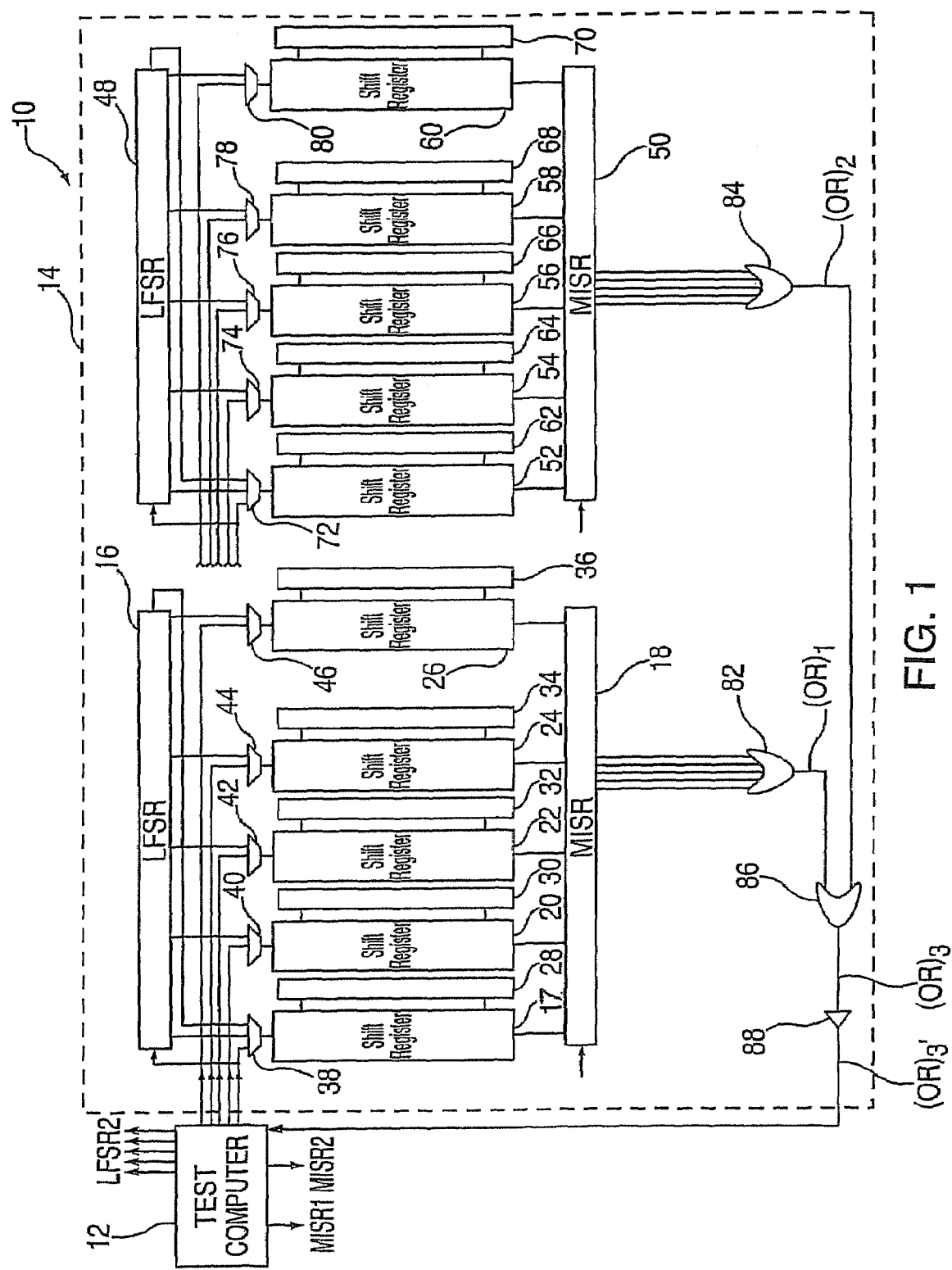
FIG. 1 is a block diagram of a system for testing a microchip in accordance with a first exemplary embodiment.

Referring to the drawings, identical reference numerals represent identical components in the various views. Referring to FIG. 1, a system 10 for testing a microchip includes a test computer 12 and a microchip 14 that utilizes an LBIST test methodology.

The test computer 12 is configured to determine first and second initial seed signature values $(SX)_1$, $(SX)_2$ for MISR 18 and MISR 50, respectively, as will be explained in greater detail below.

Microchip 14 includes LFSR 16, MISR 18, multiplexers 38, 40, 42, 44, 46, shift registers 17, 20, 22, 24, 26, and first set of devices 28, 30, 32, 34, 36. Microchip 14 further includes LFSR 48, multiplexers 72, 74, 76, 78, 80, shift registers 52, 54, 56, 58, 60, and sets of devices 62, 64, 66, 68, 70. Microchip 14 further includes OR logic gates 82, 84, 86 and buffer driver 88. It should be noted that one or more logic devices may be in both the first set of devices 28, 30, 32, 34, 36 and the second set of devices 62, 64, 66, 68, 70.

LFSR 16 is provided to generate a first sequence of test data that will be input into devices 28, 30, 32, 34, 36. In particular, LFSR 16 is conventional in the art and generates a pseudo-random sequence of binary values that will be transmitted through multiplexers 38, 40, 42, 44, 46 into shift registers (also called scan chains) 17, 20, 22, 24, 26. Each of the shift registers 17, 20, 22, 24, 26 receive binary test values from LFSR 16 and then clock the values into devices 28, 30, 32, 34, 36 using a system clock signal. Each of the sets of devices 28, 30, 32, 34, 36 may comprise a plurality of combinatorial or sequential logic devices (not shown). Further, each of the sets of shift registers 17, 20, 22, 24, 26 may receive binary output values from the combinatorial or sequential logic devices using a system capture clock signal and then shifting the binary values to an MISR 18.

MISR 18 is provided to receive the output binary values from the first set of devices 28, 30, 32, 34, 36 and generate a first final signature value $(SO)_1$ based upon the output signals. In particular MISR 18 is conventional in the art and accumulates (i.e., sums) the binary values received from devices 28, 30, 32, 34, 36. MISR 18 is initialized to an initial seed signature value $(SI)_1$ from test computer 12, as will be explained in greater detail below, in order to obtain a final signature value comprising a plurality of identical binary values when devices 28, 30, 32, 34, 36 send valid output data to MISR 18.

OR logic gate 82 is provided to generate a single binary value (e.g., "0") indicating that the devices 28, 30, 32, 34, 36 are operating correctly based on a final signature value having all binary "0" values. In particular, OR logic gate 82 receives binary output values from MISR 18 and logically OR's the binary values to generate a signal $(OR)_1$. If signal $(OR)_1$ equals "0", then the first set of devices passed testing. Otherwise, if signal $(OR)_1$ equals "1", the first set of devices failed testing. It should be noted that OR logic gate 82 could be replaced with an AND logic gate (not shown) generating a signal binary value (e.g., "1") indicating the devices 28, 30, 32, 34, 36 are operating correctly based on a final signature value having all binary "1" values.

LFSR 48 is provided to generate a first sequence of test data that will be input into devices 62, 64, 66, 68, 70. In particular, LFSR 48 is conventional in the art and generates a pseudo-random sequence of binary values that will be transmitted through multiplexers 72, 74, 76, 78, 80 into shift registers 52, 54, 56, 58, 60. Each of the shift registers 52 52, 54, 56, 58, 60 receive binary test values from LFSR 48 and then shift the values into the devices 62, 64, 66, 68, 70 using a system clock signal. Each of the sets of devices 62, 64, 66, 68, 70 may comprise a plurality of combinatorial or sequential logic devices (not shown). Further, each of the sets of shift registers 52, 54, 56, 58, 60 may receive binary output values from the combinatorial or sequential logic devices and then clock the binary values to an MISR 48 using a system capture clock signal.

MTSR 50 is provided to receive the output binary values from the second set of devices 62, 64, 66, 68, 70 and to generate a second final signature value $(SO)_2$ based upon the output signals. In particular, MSR 50 is conventional in the art and accumulates (i.e., sums) the binary values received from devices 62, 64, 66, 68, 70. MISR 50 is initialized to an initial seed signature value $(SI)_2$ from test computer 12, as will be explained in greater detail below, to obtain a final signature value comprising a plurality of identical binary values when the sets of devices 62, 64, 66, 68, 70 send valid output data to MISR 50.

OR logic gate 84 is provided to generate a single binary value (e.g., "0") indicating the second set of devices 62, 64, 66, 68, 70 are operating correctly based on a final signature value having all binary "0" values. In particular, OR logic gate 84 receives binary output values from MISR 48 and logically OR's the binary values and to generate a signal $(OR)_2$ responsive thereto. If signal $(OR)_2$ equals "0', then the second set of devices passed testing. Otherwise, if signal $(OR)_2$ equals "1', the second set of devices failed testing. It should be noted that OR logic gate 84 could be replaced with an AND logic gate (not shown) generating a signal binary value (e.g., "1") indicating the second set of devices 62, 64, 66, 68, 70 are operating correctly based on a final signature value having all binary "1" values.

OR logic gate 86 is provided to generate a single binary value (e.g., "0") indicating that the first set of devices 28, 30, 32, 34, 36 and the second set devices 62, 64, 66, 68, 70 are operating correctly based on two final signature values having all binary "0" values. In particular, gate 86 logically ORs output values $(OR)_1$ and $(OR)_2$ and generates a signal $(OR)_3$. The signal $(OR)_3$ is indicative of whether the first of devices in the second set of devices passed testing. If signal $(OR)_3$ equals "0', then the first and second set of devices passed testing. Otherwise, if signal $(OR)_3$ equals "1', at least one of the first and second set of devices failed testing. It should be noted that OR logic gate 86 could be replaced with an AND logic gate (not shown) generating a signal binary value (e.g., "1") indicating the first set of devices 28, 30, 32, 34, 36 and the second set of devices 62, 64, 66, 68, 70 are operating correctly based on at least two final signature value having all binary "1" values.

Buffer driver 88 receives the signal $(OR)_3$ from gate 86 and amplifies the signal $(OR)_3$ to obtain the signal $(OR)_3'$ indicative of whether the first set of devices and the second set devices passed testing. The signal $(OR)_3'$ is transmitted to test computer 12.

Before proceeding with a detailed discussion of the method for testing devices on microchip 14, a method for determining the first seed signature value $(SI)_1$ for MISR 18 will be explained. It should be noted that the second seed signature value $(SI)_2$ for MISR 50 would be calculated in a similar manner.

The inventors herein have recognized that it would be beneficial if the final signature value from MISR 18 comprises a plurality of identical binary values after a test sequence has been completed. For example, MISR 18 could have the final signature value $(SI)_1$ having the binary values (00000) or (11111) after a test sequence is completed. Accordingly, the binary values of the final signature value can be logically ORed together to generate a single binary value indicative of whether the associated test devices passed testing. Further, the inventors herein have recognized to obtain the desired final signature value $(SI)_1$, MISR 18 must be initialized with a first seed signature value which will result in the desired final signature value $(SI)_1$ after the first sequence of test data input has been input into the devices 28, 30, 32, 34, 36.

Figure 3:
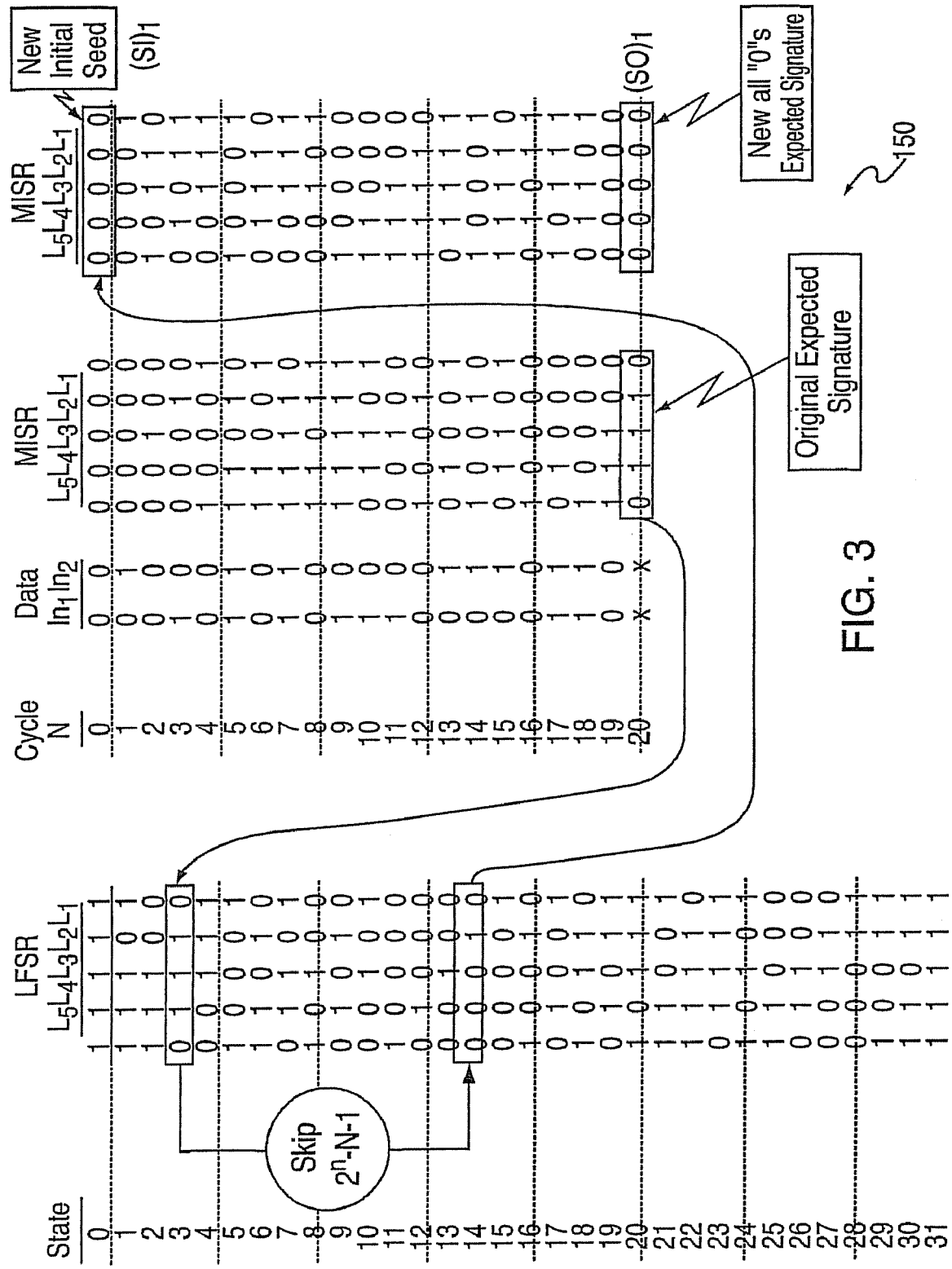
FIG. 3 is an exemplary first truth table for determining an initial seed signature value for a MISR resulting in final signature value having all binary 0's.

Referring to FIG. 3, a table 150 is shown which will be used to describe how the initial seed signature value $(SI)_1$ may be calculated so that the final signature value $(SO)_1$ of MISR 18 comprises a plurality of binary "0" values (e.g., $(SO)_1$=00000). As shown, table 150 includes the following columns: a State column, a LFSR column, a Cycle column, a Data column, a MISR column, and a MISR Seed column. The LFSR column contains a sequence of binary values output by a five-bit LFSR when the LFSR has no data input to the LFSR. The MISR column contains a sequence of binary values generated by a five-bit MISR in response to a sequence of input data $(IN_1)$, $(IN_2)$ shown in the Data column. The MISR Seed column illustrates a seed signature value (e.g., 00010) that results in a final signature value comprising a plurality of zero values (e.g., 00000) after a predetermined test sequence has been completed.

Referring to the MISR column, the method for obtaining the first seed signature value will now be explained in detail. Initially, a test computer can determine a MISR signature value after a predetermined number of cycles by performing a "good" machine simulation (GMS) after a predetermined number of cycles. For example, for a MISR initialized to all binary "0" values, the test computer could use the MISR value (01110) that would ordinarily be obtained after 20 cycles of data being input to the MISR. Next, referring to the LFSR column, the location of the selected MISR signature value would be determined in the LFSR column. For example, the MISR value (01110) is located at a State (3) location in the LFSR column. Next, the test computer can advance a predetermined number of states (e.g. $2^n$-N-1) from the location of the selected MISR signature value in the LFSR column to obtain the initial seed signature value $(SI)_1$ (e.g., $(SI)_1$=00010). The value "n" corresponds to the length of the LFSR or MISR. The value "N" corresponds to the number of test cycles (e.g., N=20)

Referring to the MISR Seed column, the test computer can initialize MISR 18 to the determined seed signature value (e.g., 00010) to thereafter obtain a final signature value $(SO)_1$ (e.g., $(SO)_1$=00000) after 20 cycles of output data from devices 28, 30, 32, 34, 36 have been input into MISR 18.

Figure 4:
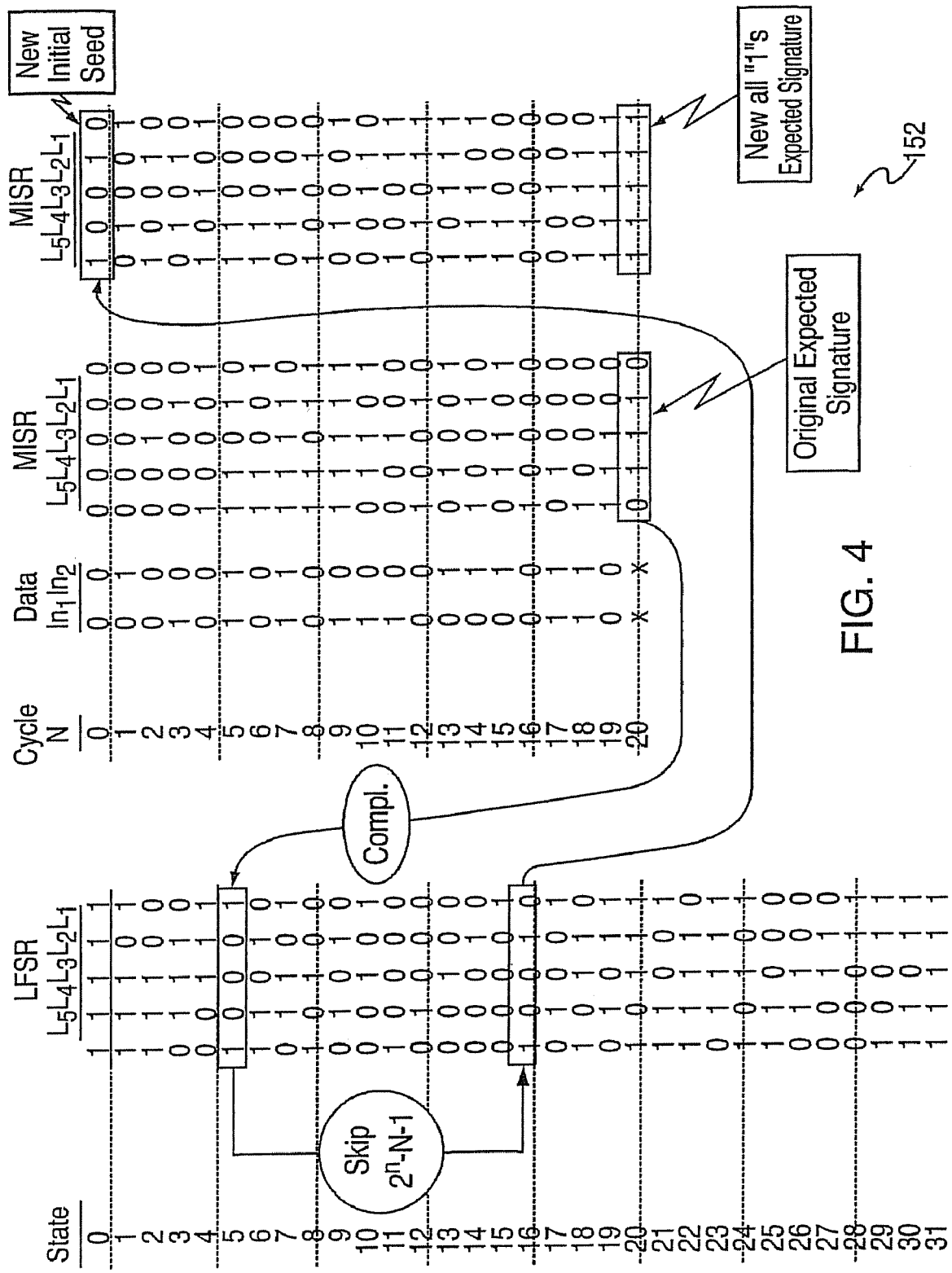
FIG. 4 is a second exemplary truth table for determining an initial seed signature value for a MISR resulting in final signature value having all binary 1's.

Referring to FIG. 4, a second table 152 is shown which can also be utilized to determine an initial seed signature value $(SI)_1$ so that the final signature value $(SO)_1$ of MISR 18 comprises a plurality of binary "1" values (e.g., $(SI)_1$=11111). Like table 150, the table 152 also includes the following columns: a State column, a LFSR column, a Cycle column, a Data column, a MISR column, and a MISR Seed column.

Referring to the MISR column, the second method for obtaining the first seed signature value $(SI)_1$ will now be explained in detail. Initially, a test computer can determine a MISR signature value after a predetermined number of cycles by performing a "good" machine simulation. For example, for a MISR initialized to all binary "0" values, the test computer could select the MISR value (01110) that would ordinarily be obtained after 20 cycles of data being input to the MISR. Next, a Boolean complement of the selected MISR value would be calculated to obtain a Boolean complement value. For example, the Boolean complement of (01110) would comprise (10001). Next, referring to the LFSR column, the location of the Boolean complement value would be determined in the LFSR column. For example, the MISR signature value (01110) is located at a State (5) location in the LFSR column. Next, the test computer can advance a predetermined number of states (e.g. $2^n$-N-1) from the location of the selected MISR signature value in the LFSR column to obtain the initial seed signature value $(SI)_1$ (e.g., 10010).

Referring to the MISR Seed column, the test computer can initialize MISR 18 to the determined seed signature value (e.g., 10010) to thereafter obtain a final signature value $(SO)_1$ (e.g., $(SO)_1$=(11111) after 20 cycles of output data from devices 28, 30, 32, 34, 36 have been input into MISR 18.

Figure 2A:
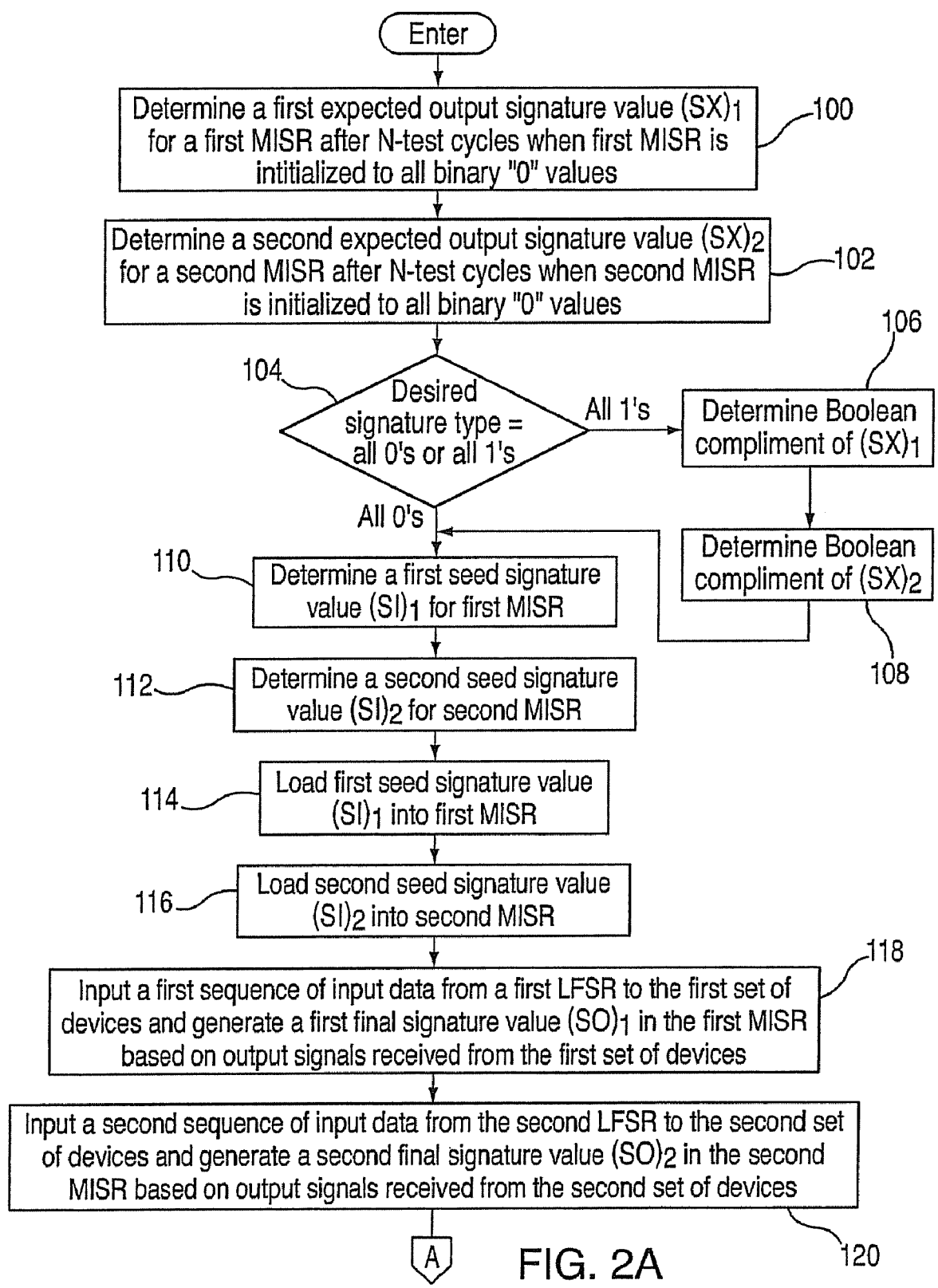
FIGS. 2A-2B are flowcharts of a method for testing electronic devices on a microchip.
Figure 2B:
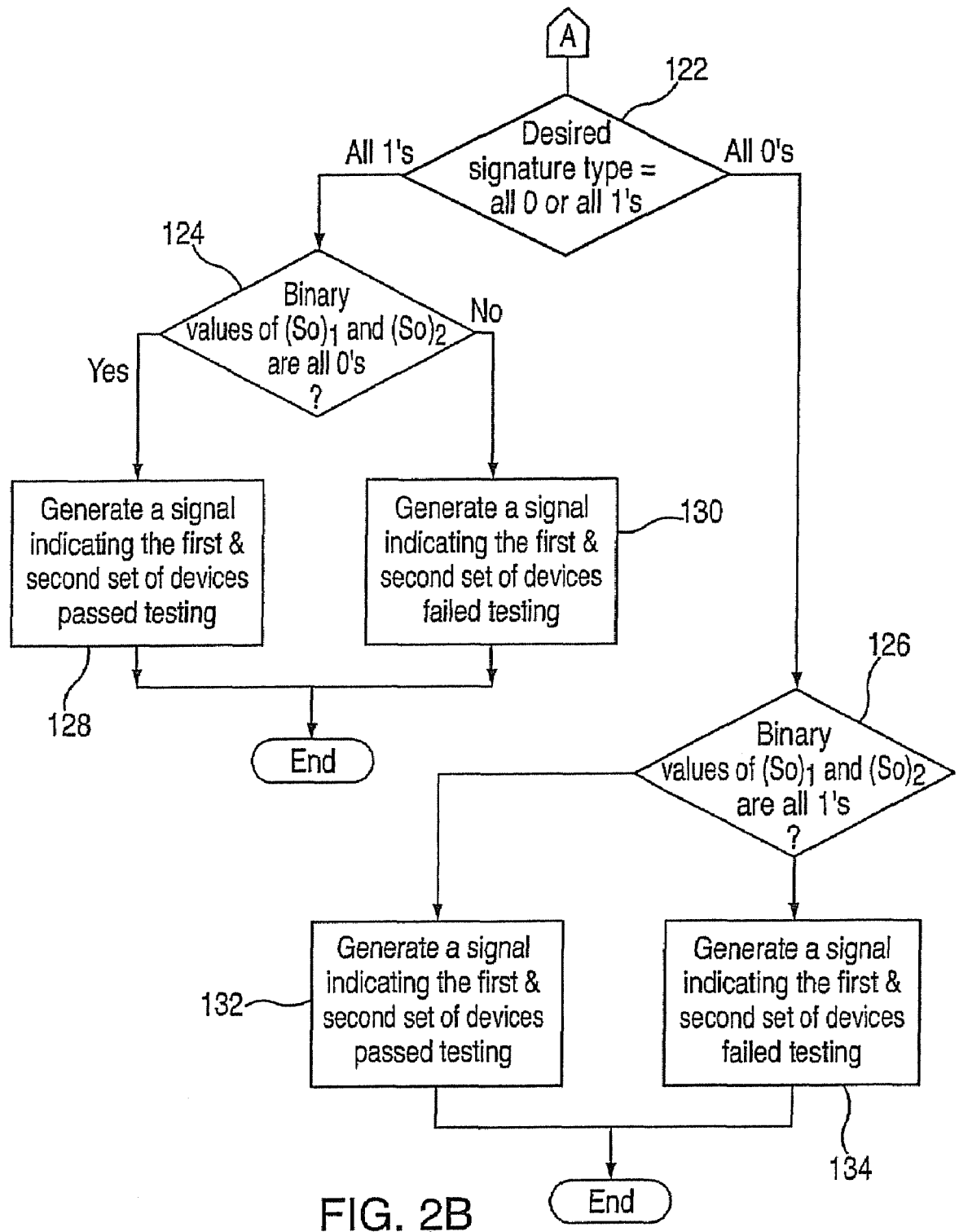

Referring to FIGS. 2A-2B, a method for testing first and second sets of electronic devices on microchip 14 will now be explained. At step 100, test computer 12 can determined a first expected output signature value $(SX)_1$ for MISR 18 after (N) test cycles.

Next at step 102, test computer 12 can determined a second expected output signature value $(SX)_2$ for MISR 50 after (N) test cycles.

Next at step 104, test computer 12 can make a determination as to whether the desired final signature value will be all binary "0" values. If the value of the step 104 equals "No", the method performs the steps 106, 108. Otherwise, the method advances to step 110. At step 106, computer 12 can determine the Boolean complement of the first expected output signature value $(SX)_1$ for MISR 18. Next at step 108, computer 12 can determine the Boolean complement of the second expected output signature value $(SX)_2$ for MISR 50. After step 108, the method advances to step 110.

At step 110, test computer 12 can determine a first seed signature value $(SI)_1$ for MISR 18 as described above. In particular, test computer 12 can utilize the table 150 to determine the first seed signature value $(SI)_1$ if a final signature value containing all binary "0" values is desired. Alternately, test computer 12 can utilize the table 152 to determine the first seed signature value $(SI)_1$ if a final signature value containing all binary "1" values is desired.

Next at step 112, test computer 12 can determine a second seed signature value $(SI)_2$ for MISR 50 utilizing table 150 or table 152 as described above.

Next at step 114, test computer 12 can load the first seed signature value $(SI)_1$ into MISR 18. It should be noted that in an alternate embodiment, microchip 14 may have a memory (not shown) in which the first seed signature value $(SI)_1$ is permanently stored and which is accessed by microchip 14 upon "power-up". Thus, the test computer 12 would not need to load the first seed signature value in this alternate embodiment.

Next at step 116, test computer 12 can load the second seed signature value $(SI)_2$ into MISR 50. It should be noted that in an alternate embodiment, microchip 14 may have a memory (not shown) in which the second seed signature value $(SI)_1$ is permanently stored and which is accessed by microchip 14 upon "power-up". Thus, the test computer 12 would not need to load the second seed signature value in this alternate embodiment.

Next at step 118, LFSR 16 inputs a first sequence of binary values to the first set of devices 28, 30, 32, 34, 36. In response, MISR 18 generates a first final signature value $(SO)_1$ based on the binary values received from the first of devices.

Next at step 120, LFSR 48 inputs a second sequence of binary values to the second set of devices 62, 64, 66, 68, 70. In response, MISR 50 generates a second final signature value $(SO)_2$ based on the binary values received from the second of devices.

Next at step 122, test computer 12 checks to see if the desired signature value type is a signature value with all binary "0" values. If the value of step 122 equals "yes", the method advances to step 124. Otherwise, the method advances to step 126.

At step 124, a determination is made as to whether the binary values of final signature values $(SO)_1$, $(SO)_2$ of MISRs 18, 50 respectively, are all binary "0" values which is indicative of "passed" test sequences. Next at step 128, if the value of step 124 equals "yes", the method advances to step 128 which generates a signal indicating the first and second sets of devices passed testing. Otherwise, if the value of step 124 equals "no", the method advances to step 130 which generates a signal indicating the first and second sets of devices failed testing.

For purposed of discussion, assume that all binary "0" values are desired for the final signature values. In this case, OR logic gate 82 receives the binary values of the first signature value $(SO)_1$ and generates a value $(OR)_1$ that corresponds to a binary value of "0", if the sets of devices 28, 30, 32, 34 to 36 passed the test sequence. Further, the OR logic gate 84 receives the binary values of signature value $(SO)_2$ and Generates a value $(OR)_2$ that corresponds to a binary value of "0 if the sets of devices 62, 64, 66, 68, 70 passed the test sequence. Thereafter, logic gate 86 receives values $(OR)_1$, $(OR)_2$ and generates the signal $(OR)_3$ having a binary value of "0". Thereafter, Buffer driver 88 generates the signal $(OR)_3{}'$ having a higher voltage or current level than $(OR)_3$ that is transmitted to test computer 12 indicating that both the first and second sets of devices passed testing. In the event that one or more of the devices in the first and second sets of devices fails a test sequence, one or more of the signals $(OR)_1$, $(OR)_2$ would have a binary value of "1". After either of steps 128, 130, the method is exited.

Referring again to step 122, if the value of step 122 equals "no", indicating that the test computer is anticipating that the desired final signature values will have a plurality of binary "1" values, the method advances to step 126.

At step 126, a determination is made as to whether the binary values of final signature values $(SO)_1$ and $(SO)_2$ of MISR 18 and MISR 50 respectively, are all binary "1" values which is indicative of a "passed" test sequence. If the value of step 126 equals "yes", the method advances to step 128 which generates a signal indicating the first and second sets of devices passed testing. Otherwise, if the value of step 126 equals "no", the method advances to step 134 generates a signal indicating the first and second sets of devices failed testing. After either of steps 132, 134 the method is exited.

Figure 5:
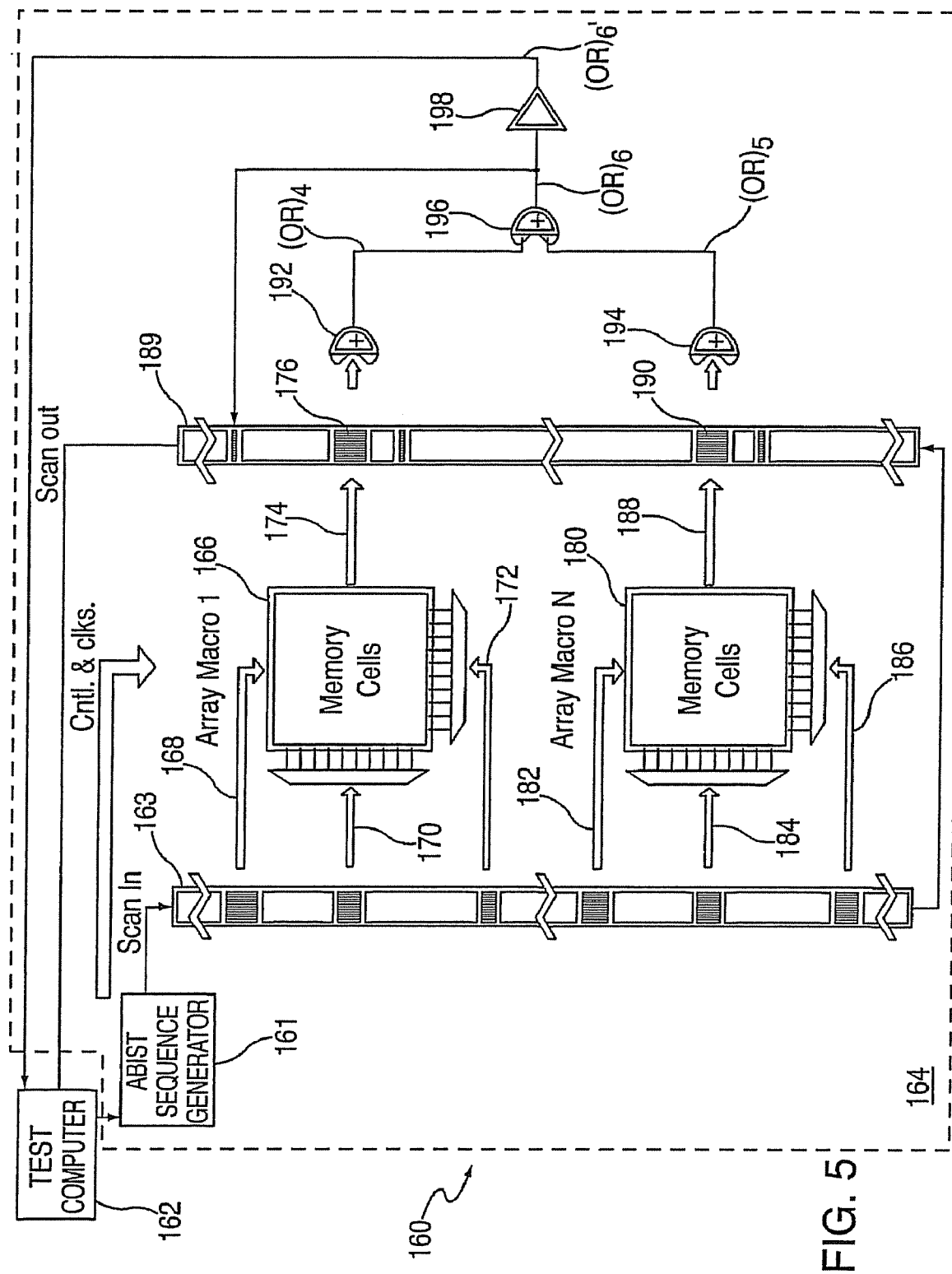
FIG. 5 is a block diagram of a system for testing a microchip in accordance with a second exemplary embodiment.

Referring to FIG. 5, a system 160 for testing a microchip that utilizes an array built-in-self test (ABIST) methodology is illustrated. The system 160 includes a test computer (also referred to as a test sequence controller) 162 and a microchip 164. The test methodology utilized in system 160 utilizes an ABIST Sequence Generator to generate binary test patterns for testing the devices instead of the using the LFSRs of system 10. It should be noted that the ABIST Sequence Generator could be a separate module or could be implemented directly on microchip 164.

The test computer 160 is configured to determine first and second initial seed signature values $(SX)_1$, $(SX)_2$ for initializing MISR 176 and MISR 190, in a similar fashion as discussed above with respect to test computer 12. In other words, MISR 176 and MISR 190 could both be initialized to initial seed values such that after the test sequence each of the signature values from MISR 176 and MISR 190 would have all binary "0" values or all binary "1" values if the tested devices operated correctly.

Microchip 64 includes a shift register 163, MISR 176, MISR 190, memory arrays 166, 180, OR logic gates 192, 194, 196 and buffer driver 198. The microchip 64 may also include the ABIST Sequence Generator 161 that is well known to those skilled in the art.

ABIST Sequence Generator 161 is provided to generate first and second sequences of test data that will be input into memory arrays 166, 180. ABIST Sequence Generator 161 generates a first sequence of binary test values that is input through shift register 163 and a data line 168 to memory array 166. The location where each of the binary test values are stored in memory array 166 is determined by (i) the "word address" transmitted to array 168 via word address line 170 and (ii) the "bit address" transmitted to array 166 via line 172 has known by the skilled in the art. Further, ABIST Sequence Generator 161 generates a second sequence of binary test values that is input through shift register 163 and a data line 182 to memory array 180. The location where each of the binary test values are stored in memory array 180 is determined by (i) the "word address" transmitted to array 180 via word address line 184 and (ii) the "bit address" transmitted to array 180 via line 186 as known by those skilled in the art.

During the transmission of the first and second test sequences to the memory arrays 166, 180, the binary values stored in memory arrays 166, 188 are transmitted via lines 174, 188 to MISRs 176, 190, respectively. MISRs 176, 190 generate final output signature values $(SO)_3$, $(SO)_4$, respectively, in response to the binary output values received from arrays 166, 180 as known by those skilled in the art.

As discussed above with respect to system 10, the system 160 can initialize MISR 176 and MISR 192 to first and second seed signature values, respectively, that will result in the final output signature values $(SO)_3$, $(SO)_4$ being all binary "0" values or all binary "1" values.

Further, the logic gates 192, 194, can generate signals $(OR)_4$, $(OR)_5$, respectively to indicate whether the memory arrays 166, 180 passed or failed the first and second test sequences, respectively. Still further, logic gate 196 can generate a binary signal $(OR)_6$ indicating whether the memory arrays 166, 180 passed the first and second test sequences. Finally, buffer driver 198 can amplify signal $(OR)_6$ to obtain signal $(OR)_6{}'$ and then transmit the signal to test computer 162. Thereafter, test computer 162 can indicate whether the memory arrays 166, 180 passed or failed the first and second test sequences based on the signal $(OR)_6{}'$. It should be noted that in an alternate embodiment, each of OR logic gates 192, 194, 196 could be replaced with an AND gate.

The system and method for testing first and second sets of electronic devices on a microchip provide substantial advantages over known systems and methods. In particular, the inventive method and system provides a single binary value (based on first and second final signature values) to determine whether first and second sets of devices have passed or failed testing. Accordingly, the inventive system and method does not require that the first and second final signature values be compared to first and second expected signature values to determine whether the first and second sets of devices have passed or failed testing, which decreases the amount of computing effort needed to test devices on a microchip.

While the invention is described with reference to an exemplary embodiment, it will be understood by those skilled in the art that various changes may be made an equivalence may be substituted for elements thereof without departing from the scope of the invention. In addition, many modifications may be made to the teachings of the invention to adapt to a particular situation without departing from the scope thereof. Therefore, is intended that the invention not be limited the embodiment disclosed for carrying out this invention, but that the invention includes all embodiments falling with the scope of the intended claims. Moreover, the use of the term's first, second, etc. does not denote any order of importance, but rather the term's first, second, etc. are us are used to distinguish one element from another.

We claim:

1. A method for testing first and second sets of electronic devices on a microchip, the first set of devices receiving input data and then sending output data to a first MISR, the second set of devices receiving input data and then sending output data to a second MISR, the method comprising:
   determining a first seed signature value associated with the first MISR that induces the first MISR to have a first final signature value comprising a plurality of identical binary values when the first set of devices send valid output data to the first MISR when receiving a first predetermined sequence of input data;
   determining a second seed signature value associated with the second MISR that induces the second MISR to have a second final signature value comprising a plurality of identical binary values when the second set of devices send valid output data to the second MISR when receiving a second predetermined sequence of input data;
   initializing first and second states of the first MISR and the second MISR, respectively, to the first and second signature values, respectively;
   inputting the first and second predetermined sequences of input data to the first and second set of devices, respectively, and generating first and second final signatures values from output data received from the first and second set of devices, respectively; and,
   indicating that the first and second set of devices have failed testing when at least one of the plurality of binary values in the first and second final signature values are not identical.

2. The method of claim 1 further comprising indicating that first and second sets of devices have passed testing when each of the plurality of binary values in the first and second final signature values have an identical binary value.

3. The method of claim 2 wherein the each of the plurality of binary values in the first and second final signature values have a binary value of 1 when the first and second set of devices passed testing.

4. The method of claim 2 wherein the each of the plurality of binary values in the first and second final signature values have a binary value of 0 when the first and second set of devices passed testing.

5. The method of claim 1 wherein each of the first and second set of electronic devices include at least one of combinatorial logic devices, sequential logic devices, memory arrays.

6. The method of claim 1 wherein each of the first and second set of electronic devices comprise memory arrays.

7. The method of claim 1 wherein the step of determining a first seed signature value, comprises:
   determining an expected signature value indicative of the first set of devices passing testing;
   calculating a second value corresponding to a Boolean complement of the expected signature value; and,
   selecting the first seed signature value from a sequence of output values generated by a LFSR receiving no data, the selection being based on a position of the second value in the sequence of output values.

8. The method of claim 1 wherein the step of determining a first seed signature value, comprises:
   determining an expected signature value indicative of the first set of devices passing testing; and,
   selecting the first initial output signature value from a sequence of output values generated by a LFSR receiving no data, the selection being based on a position of the expected signature value in the sequence of output values.

9. The method of claim 1 wherein the first predetermined sequence of input data comprises a sequence of binary numbers.

10. A system for testing first and second sets of electronic devices on a microchip, comprising:
    a test computer operatively coupled to a first LFSR, a second LFSR, a first MISR, and a second MISR, the test computer configured to determine a first seed signature value associated with the first MISR that induces the first MISR to have a first final signature value comprising a plurality of identical binary values when the first set of devices send valid output data to the first MISR when receiving a first predetermined sequence of input data, the test computer further configured to determine a second seed signature value associated with the second MISR that induces the second MISR to have a second final signature value comprising a plurality of identical binary values when the second set of devices send valid output data to the second MISR when receiving a second predetermined sequence of input data, the test computer further configured to initialize first and second states of the first and second MISRs, respectively, to the first and second seed signature values, respectively;

a first LFSR configured to transmit the first predetermined sequence of test data to the first set of devices;

a second LFSR configured to transmit the second predetermined sequence of test data to the second set of devices;

the first and second MISRs configured to generate first and second final signature values from the output data received from the first and second set of devices, respectively; and, a circuit configured to indicate the first and second set of devices have failed testing when at least one of the plurality of binary values in the first and second final output signature values are not identical.

11. The system of claim 10 wherein the circuit further indicates the first and second sets of devices have passed testing when each of the plurality of binary values in the first and second final signature values have an identical binary value.

12. The system of claim 10 wherein each of the plurality of binary values in the first and second final signature values have a binary value of 0 when the first and second set of devices passed testing.

13. The system of claim 10 wherein each of the first and second set of electronic devices include at least one of combinatorial logic devices, sequential logic devices, memory arrays.

14. The system of claim 10 wherein each of the first and second set of electronic devices comprise memory arrays.

15. The system of claim 10 wherein the circuit comprises:
a first OR logic gate receiving each binary value associated with the first final signature value and generating a first binary value;
a second OR logic gate receiving each binary value associated with the second final signature value and generating a second binary value; and,
a third OR logic gate receiving the first and second binary values and generating a third binary value indicative of whether the first and second sets of devices passed the testing.

16. The system of claim 10 wherein the test computer is further configured to determine an expected signature value indicative of the first set of devices passing testing, the test computer further configured to calculate a second value corresponding to a Boolean complement of the expected signature value, and the test computer further configured to select the first seed signature value from a sequence of output values generated by a LFSR receiving no data, the selection being based on a position of the second value in the sequence of output values.

17. The system of claim 10 wherein the test computer is further configured to determine an expected signature value indicative of the first set of devices passing testing, the test computer further configured to select the first seed signature value from a sequence of output values generated by a LFSR receiving no data, the selection being based on a position of the expected signature value in the sequence of output values.

18. The system of claim 10 wherein the first predetermined sequence of input data comprises a sequence of binary numbers.

19. The system of claim 10 wherein the circuit comprises:
a first AND logic gate receiving each binary value associated with the first final signature value and generating a first binary value;
a second AND logic gate receiving each binary value associated with the second final signature value and generating a second binary value; and,
a third AND logic gate receiving the first and second binary values and generating a third binary value indicative of whether the first and second sets of devices passed the testing.

20. A system for testing first and second sets of electronic devices on a microchip, comprising:
a first MISR having a first seed signature value to obtain a first final signature value comprising a plurality of identical binary values when the first set of devices send valid output data to the first MISR;
a second MISR being having a second seed signature value to obtain a second final signature value comprising a plurality of identical binary values when the second set of devices send valid output data to the second MISR;
at least one apparatus configured to transmit the first predetermined sequence of test data to the first set of devices and a second predetermined sequence of test data to the second set of devices;
the first and second MISRs configured to generate first and second final signature values from the output data received from the first and second set of devices, respectively; and,
a circuit configured to indicate the first and second set of devices have failed testing when at least one of the plurality of binary values in the first and second final output signature values are not identical.

* * * * *